US006432773B1

(12) United States Patent
Gerber et al.

(10) Patent No.: US 6,432,773 B1
(45) Date of Patent: Aug. 13, 2002

(54) MEMORY CELL HAVING AN ONO FILM WITH AN ONO SIDEWALL AND METHOD OF FABRICATING SAME

(75) Inventors: Donald S. Gerber, Phoenix; Neil Deutscher, Tempe; Robert P. Ma, Phoenix, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/288,597

(22) Filed: Apr. 8, 1999

(51) Int. Cl.[7] ............................................. H01L 21/336
(52) U.S. Cl. ...................... 438/261; 438/265; 438/591; 438/593
(58) Field of Search .............................. 438/258, 261, 438/267, 265, 591, 593, 595, 696

(56) References Cited

U.S. PATENT DOCUMENTS 5,445,984 A * 8/1995 Hong et al. ................. 438/264
5,625,213 A * 4/1997 Hong et al. ................. 257/321
5,783,475 A * 7/1998 Ramaswami ................ 438/303
5,790,455 A    8/1998 Caywood ............... 365/185.06
5,939,763 A * 8/1999 Hao et al. ................... 257/411

* cited by examiner

Primary Examiner—Carl Whitehead, Jr.
Assistant Examiner—Christy Novacek
(74) Attorney, Agent, or Firm—Baker Botts L.L.P.

(57) ABSTRACT

A merged two transistor memory cell of an EEPROM, and method of fabricating same, is provided. The memory cell includes a substrate and insulating layer formed on the substrate. It also includes a memory transistor having a floating gate and a control gate, and a select transistor having a gate that is shared with the memory transistor. The memory cell is configured so that the shared gate serves both as the control gate of the memory transistor and the wordline of the select transistor. The memory cell further includes an ONO stack film that is disposed between the floating gate and the shared gate. In fabricating the memory, the ONO stack film is formed adjacent to the top and side surfaces of the floating gate. The ONO stack film is also formed so as not to be interposed between a potion of the shared gate that is adjacent to the substrate and the insulating layer.

13 Claims, 19 Drawing Sheets

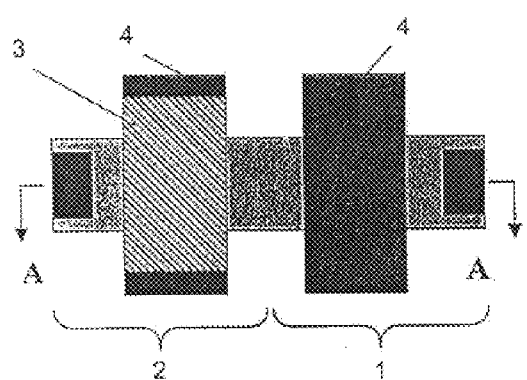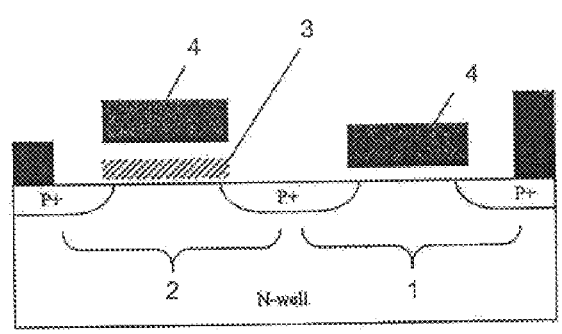
Figure 1
(Prior Art)
Figure 2
(Prior Art)

MEMORY CELL HAVING AN ONO FILM WITH AN ONO SIDEWALL AND METHOD OF FABRICATING SAME

FIELD OF THE INVENTION

The present invention relates generally to memory cells of semiconductor devices, and more particularly to a merged two transistor memory cell having an ONO stack film with an ONO sidewall that is placed between a floating gate of the memory transistor and the gate shared between the memory transistor and select transistor and a method of making same.

BACKGROUND OF THE INVENTION

EEPROM (Electrically Erasable Programmable Read Only Memory) cells are a class of nonvolatile semiconductor memory in which information may be electrically programmed into and erased from each memory element or cell. Floating gate EEPROM cells are one type of EEPROM cell in which information is stored by placing electronic charge on a "floating gate", typically a region of conductive polysilicon that is electrically isolated from other conducting regions of the device by insulating dielectric layers that surround it. The charge on the floating gate can be detected in reading the memory cell because it changes the threshold voltage of the memory transistor. This change in threshold voltage changes the amount of current that flows through the cell when voltages are applied to it during the read operation and the current can be detected by a sense amplifier circuit.

As stated above, EEPROM cells are nonvolatile, which means that they must retain their information (charge state) even when the power supplied to them is turned off. Thus, it is critically important that the charge stored on the floating gate not "leak" off over time. A product containing EEPROM cells usually has a retention specification in its data sheets which states how long the EEPROM memory cells will retain the information programmed into them without error when the power supplied to them is turned off. Retention specifications typically range between 1 and 20 years. Thus, the dielectric isolation surrounding the floating gate must have very good integrity and this integrity must exist with respect to all of the cells in the memory device. Prior art solutions to this problem proved inadequate as the demand for smaller cell size increased.

In one prior art solution, the control gate is isolated from the floating gate by growing a poly-oxide layer, e.g., a silicon dioxide ($SiO_2$) layer, on the polysilicon floating gate. The control gate polysilicon layer is then deposited on top of the poly-oxide layer. Silicon dioxide grown on heavily doped polysilicon, however, is not a good quality dielectric, and thus for good charge retention, the polysilicon oxide must be relatively thick (>500A) for a viable manufacturing process. To scale the cell area down, while maintaining the same coupling ratio, and thus the same programming voltages, the oxide between the floating gate and control gate must be thinned down, which in turn jeopardizes the integrity of the charge retention, and thus makes this solution less than desirable for smaller cell size devices.

Later solutions were developed in which a 3-layer stack of dielectrics (ONO), consisting of a bottom layer of silicon dioxide, a middle layer of silicon nitride ($Si_3N_4$), and top layer of silicon dioxide, was used as the dielectric isolation between the floating and control gates. In one later solution, the oxide layers in the ONO stack are either thermally grown on the polysilicon floating gate and silicon nitride layer or deposited films. In this solution, the poly 1 layer forming the floating gate and the ONO stack are etched together, so that the ONO stack is self aligned with the floating gate. After this step, a thermal poly-oxide is formed on the sidewall of the floating gate. A drawback of this solution is that the poly-oxide formed on the sidewall of the floating gate was either too thin or prevent the leakage of charge or too thick to make scalability practical. In another later solution, the poly 1 layer forming the floating gate is etched before the ONO film is formed on the floating gate. The drawback of this solution is that the ONO film forms in the gate area of the select transistor. The reason that it is not desirable to have the ONO film in the gate area of the select transistor is that the silicon nitride layer has a tendency to trap electrons and this causes the threshold voltage of the select transistor to drift with the electrical stress to which it is subject during the program and erase operations. This threshold voltage instability is very damaging to the overall cell reliability.

Both of these later solutions employing an ONO stack film, however, proved to be superior to a purely thermally grown polysilicon oxide or a deposited and annealed oxide alone, with respect to both scalability and charge retention. Another advantage of an all-deposited ONO stack is that the pin hole defect density of the stack is greatly reduced since the probability of pin holes overlapping in all three layers is extremely small. Currently, ONO stacks with effective oxide thickness as low as 200A are used.

The idea of employing an ONO stack to isolate the floating and control gates in a modern EEPROM process has also been applied to a type of floating gate EEPROM cell design known as a "split-gate" cell. In traditional two-transistor byte selectable EEPROM cells, a select transistor 1 is in series with each memory cell transistor 2, which includes a poly 1 floating gate 3, as shown in FIGS. 1 and 2. In this configuration, the select transistor 1 is used to isolate the memory transistor 2 during the read and erase operations, and each transistor has its own poly 2 gate 4. The two-transistor configuration takes up considerable area, however. To reduce the die area consumed, it is possible in some cells to merge the select and memory transistors so that they share the same polysilicon gate 30, as shown in FIGS. 3 and 4. (It should be noted that the same reference numerals used in identifying specific elements in FIGS. 7 and 8 discussed in the detailed description below are used in reference to identical elements referred to in prior art FIGS. 3–6). This same configuration is used to increase the programming efficiency of channel hot carrier programmed EEPROM cells and are known as source-side injection (SSI) cells.

In p-channel EEPROM cells programmed by Fowler-Nordheim tunneling, the shared polysilicon gate 30' may completely overlap the floating gate 28 on both sides, thus splitting the select transistor channel on either side of the floating gate memory transistor channel, as shown in FIGS. 5 and 6. In either case (FIG. 3 and 4 or FIGS. 5 and 6), it is preferable to have an ONO stack separate the floating gate and control gate polysilicon layers (not shown in FIG. 3–6), while at the same time not having the ONO for the gate dielectric of the merged select transistor. Electron trapping still occurs in the ONO stack between the floating and control gates, but this appears as a transient threshold voltage shift of the memory transistor after program or erase and is small in a properly designed process. The threshold shift in the select gate has a more severe effect because the select gate threshold needs to be large enough that bitline current is shut off in a deselected cell, which is in the conductive state. Current leakage in the many deselected cells, which share a common bitline, can cause an "off" cell being read in the one selected wordline to erroneously appear to be in the "on" state.

While the prior solutions employing the ONO stack films are an improvement over earlier solutions employing a thermally grown silicon dioxide layer, they still have several drawbacks. Accordingly, an improved dielectric isolation between the floating gate and control gate is desired.

SUMMARY OF THE INVENTION

In one aspect of the present invention, a memory cell of a semiconductor device is provided. The memory cell includes a first conductive layer having a top surface and a side surface. In one embodiment, the first conductive layer is floating gate of a memory transistor of the memory cell. The memory cell further includes a second conductive layer, which in one embodiment is a gate that connects the memory transistor of the memory cell to an associated select transistor. The memory cell according to the present invention further includes an ONO film disposed between the first conductive layer and the second conductive layer. The ONO film is further disposed adjacent to the top surface and the side surface of the first conductive layer.

In another aspect of the present invention, the memory cell further includes a substrate and an insulating layer. In this embodiment, the insulating layer is disposed between the substrate and the first conductive layer and a portion of the second conductive layer that is disposed adjacent to the substrate. The ONO film is further disposed so as not to interpose the insulating layer and portion of the second conductive layer disposed adjacent to the substrate. This embodiment minimizes the leakage of charge from the first conductive layer.

In yet another aspect of the present invention, a method of fabricating a memory cell of semiconductor device is provided. The method includes the steps of forming an insulating layer on a substrate, depositing a conductive layer having a top surface and a side surface, and forming an ONO film adjacent to the top surface and the side surface of the conductive layer. The method further includes the step of forming a conductive layer on the ONO film.

BRIEF DESCRIPTION OF THE DRAWINGS

Other objects and advantages of the invention will become apparent upon reading the following detailed description and upon reference to the drawings in which:

FIG. 1 is a plan view of a prior art p-channel two transistor cell of an EEPROM.

FIG. 2 is a cross-sectional view through line A—A of the prior art p-channel two-transistor cell shown in FIG. 1.

FIGS. 10–20 illustrate the process steps involved in fabricating the ONO film of the p-channel split gate cell according to the present invention.

Figure 3:
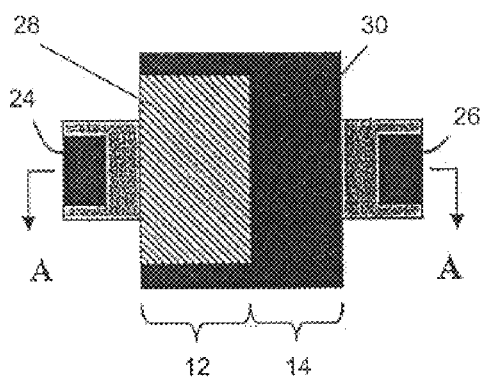
FIG. 3 is a plan view of prior art p-channel split gate cell of an EEPROM.
Figure 4:
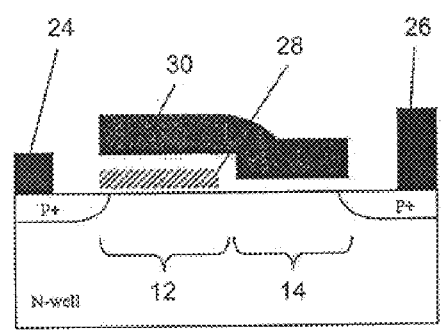
FIG. 4 is a cross-sectional view through line A—A of the prior art p-channel split gate cell shown in FIG. 3.
Figure 5:
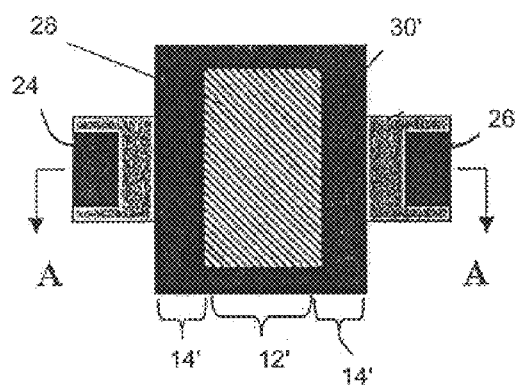
FIG. 5 is a plan view of a prior art p-channel split gate cell of an EEPROM having a select transistor channel that is split on either side of the memory transistor.
Figure 6:
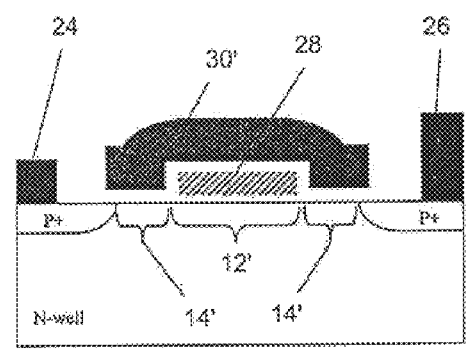
FIG. 6 is a cross-sectional view through line A—A of the prior art p-channel split gate cell shown in FIG. 5.

While the present invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. For example, although the invention is described relating to merged two transistor memory cells of EEPROMs, such as those shown in FIGS. 7 and 8, it may have application in other memory cell devices.

DETAILED DESCRIPTION OF THE PREFERRED EMBODIMENTS

Turning to the drawings, the preferred embodiments of the present invention will now be described. A p-channel split-gate memory cell of an EEPROM device according to one embodiment of the present invention is illustrated generally by reference numeral 10 in FIG. 7. The memory cell 10 includes a memory transistor 12 and select transistor 14 formed on a silicon substrate 16. The substrate 16 is defined by p-diffusions 18 and 20 and N-well 22. Reference numeral 24 refers to the metal source contact, which is disposed on p-diffusion 18 and reference numeral 26 refers to the metal bitline (drain) contact, which is disposed on p-diffusion 20.

Figures 7, 8:
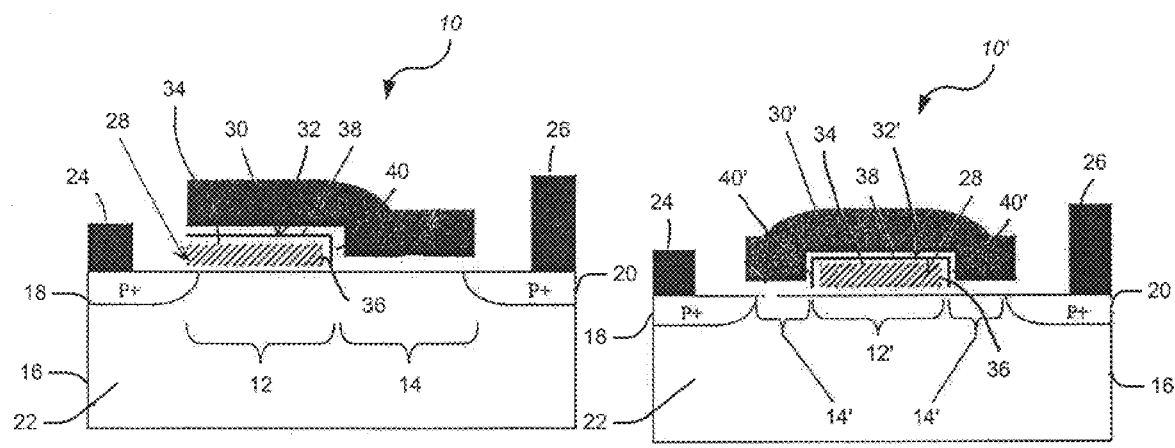
FIG. 7 is a cross-sectional view of a p-channel split gate cell of an EEPROM according to the present invention.
FIG. 8 is a cross-sectional view of a p-channel split gate cell of an EEPROM having a select transistor channel that is split on either side of the memory transistor according to the present invention.

The memory transistor 12 includes a floating gate 28, which is a conductive layer, control gate 30, which is a conductive layer and is also shared with the wordline of the select transistor 14, and an ONO film 32, which is a dielectric layer disposed between the floating gate 28 and the control or shared gate 30, as shown in FIG. 7. The floating gate 28 has a top surface 34 and a side surface 36. In accordance with the present invention, the ONO film 32 has a top 38, which is disposed adjacent to the top surface 34 of the floating gate 28, and a sidewall 40, which is disposed adjacent to a portion of the side surface 36 of the floating gate. The sidewall 40 of the ONO film 32 helps to minimize the leakage of charge from the side surface 36 of the floating gate 28.

The select transistor 14 includes wordline 30, which, as noted above, is also the gate shared with the memory transistor 12. Gate oxides (not shown in FIG. 7) are also provided between the floating gate 28 and the silicon substrate 16, and the shared gate 30 (130) and silicon substrate 16 (see FIG. 24).

FIG. 8 illustrates another embodiment of the present invention. In this embodiment, the shared gate, which is illustrated by reference numeral 30', is split on either side of the floating gate 28, i.e., the shared gate 30' surrounds the entire side surface 36 of the floating gate. Also, in this embodiment, the sidewall 40' of the ONO film 32' is disposed adjacent to the entire side surface 36 of the floating gate 28. It should be noted that identical reference numerals are used in FIGS. 7 and 8 for identical elements.

Figure 9:
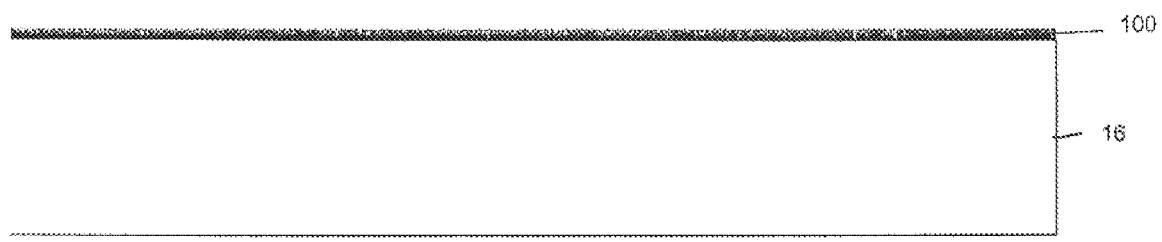
FIG. 9 illustrates the step of growing a silicon dioxide layer on the substrate which is performed during the fabrication of the insulating layer of the p-channel split gate cell according to the present invention.

The method of fabricating the memory cells 10, 10' will now be described with reference to FIGS. 9 through 24. After other steps in the process of manufacturing the memory cells 10, 10' have been performed, such as well formation, device isolation, threshold adjust implants, etc, which do not form a part of the present invention, the gate oxide of the memory transistor 12, 12' is formed. This step is performed by growing a $SiO_2$ layer 100 on the substrate 16, as shown in FIG. 9. As those of ordinary skill in the art will appreciate, the layer 100 may also be a tunnel oxide and typically has a thickness in the range of 80–120A.

Figure 10:
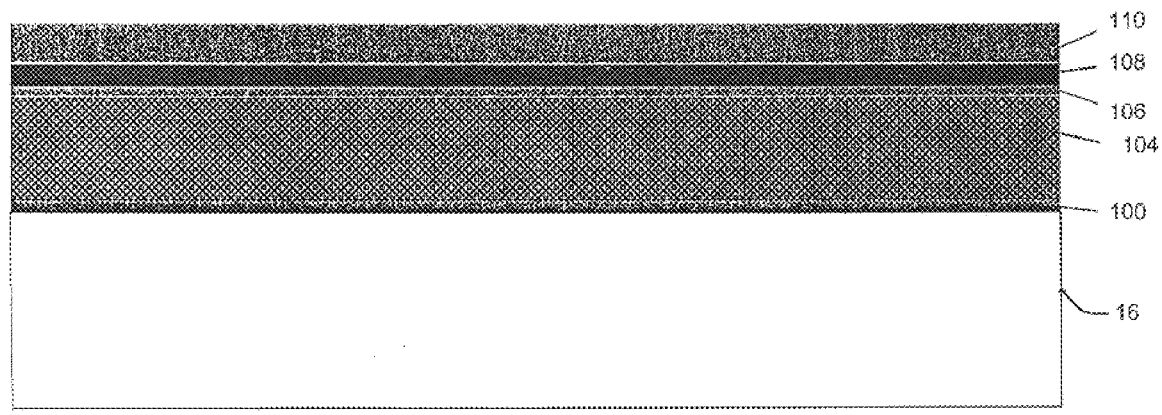
FIGS. 10–14 illustrate process steps involved in fabricating the first conductive layer of the p-channel split gate cell according to the present invention.

In the next phase in the process, the floating gate of the memory transistor and ONO film are formed. These steps proceed as follows. First, a polysilicon layer 104, preferably with a thickness in the range of 1000–3000A, is deposited on the gate oxide 100, as shown in FIG. 10. Next, a $SiO_2$ layer 106, preferably with a thickness in the range of 60–120A, is deposited on top of the polysilicon layer 104, as shown in FIG. 10. This layer becomes the bottom oxide of the ONO film disposed on the top surface 34 of the floating gate 28. Next, a silicon nitride ($Si_3N_4$) layer 108, preferably with a thickness in the range of 60–200A, is deposited on the $SiO_2$ layer 106, as shown in FIG. 10. This layer becomes the silicon nitride layer of the ONO film on the top surface of the floating gate. Next, a $SiO_2$ layer 110, preferably with a thickness of 100–500A, is deposited on the silicon nitride ($Si_3N_4$) layer 108, as shown in FIG. 10. This layer is a sacrificial oxide layer used to protect the $Si_3N_4$ layer 108 in subsequent etching steps.

Figure 11:
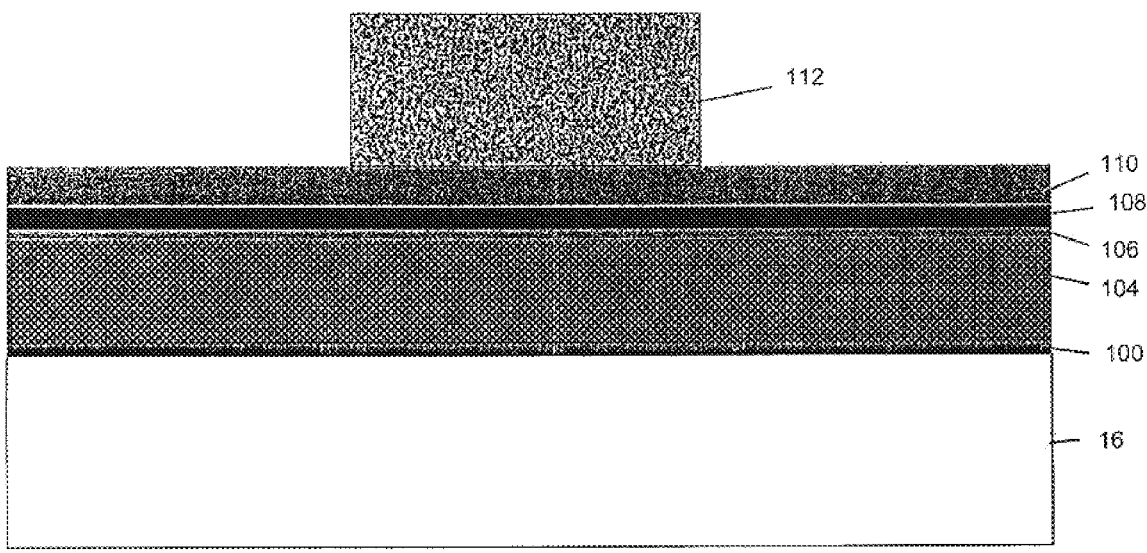
Figure 12:
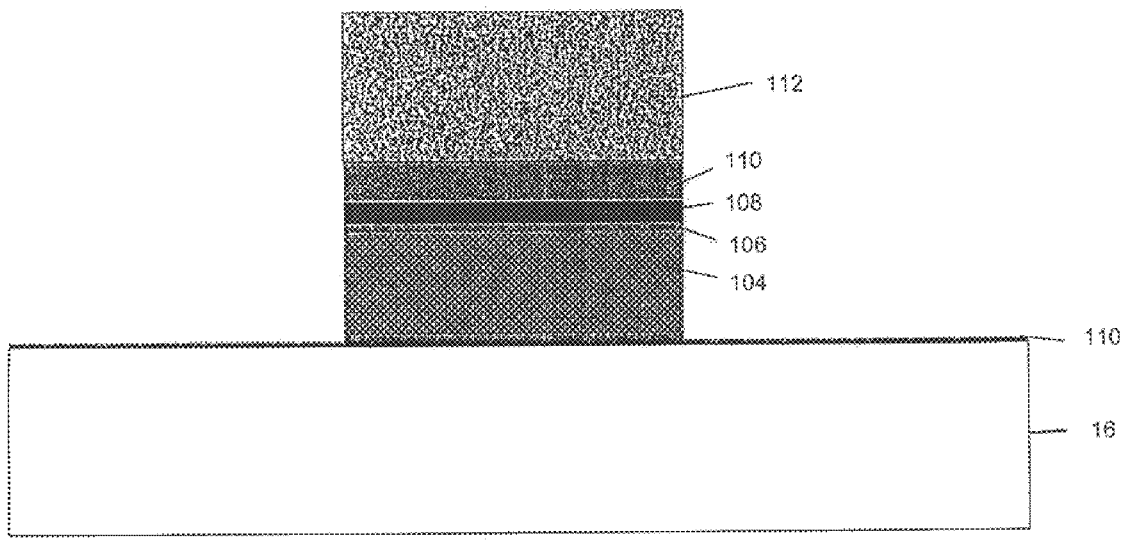
Figure 13:
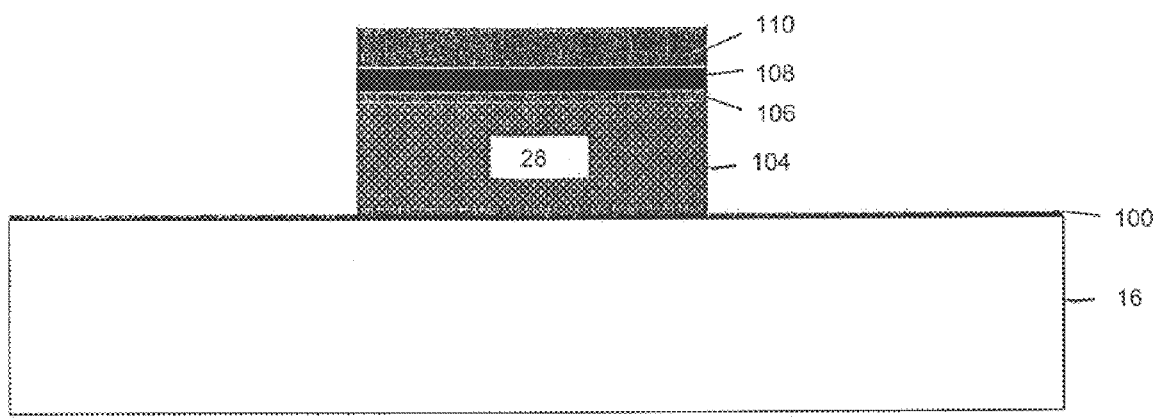

Next, a protective photoresist layer 112 is deposited on the stack of films formed, as shown in FIG. 11. The photoresist layer 112 is patterned with a mask and used to define the floating gate 28. The stack of films is then anisotropically etched down to the bottom-most $SiO_2$ layer 100 so as to leave at least a portion of the $SiO_2$ layer 100 on the substrate 16, as shown in FIG. 12. The photoresist layer 112 protects the floating gate areas during etching. The photoresist layer 112 is then removed by a dry or wet chemical etching process, as shown in FIG. 13, thus leaving a floating gate pattern 28 etched in the film stack.

Figure 14:
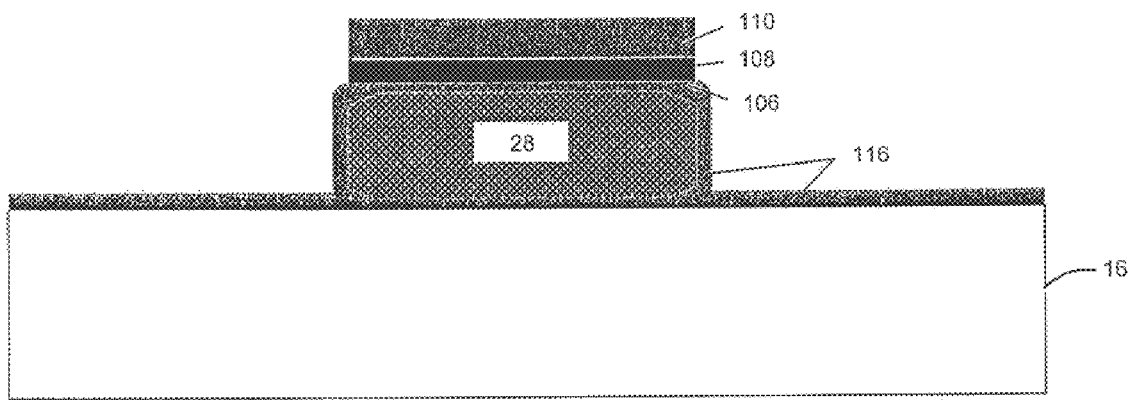

The next step in the process is a thermal oxidation step. In this step, a $SiO_2$ layer 116 is grown on the side walls of the conductive layer 104 and on the substrate 16 outside of area of the floating gate, as shown in FIG. 14, by supplying oxygen in the temperature range of 850–950 deg-C. This layer becomes the bottom $SiO_2$ layer of the ONO stack on the sidewalls of the floating gate 28, and forms to a thickness in the range of 80–300A. As shown in FIG. 14, there is some lateral oxidation of the polysilicon in the floating gate 28 that occurs under the $Si_3N_4$ layer 108. However, almost no oxide grows on the $Si_3N_4$ layer sidewalls at these temperatures. This is important in that it allows a second deposited layer of $Si_3N_4$ to come into contact with the sidewalls of the first $Si_3N_4$ layer (layer 108) to seal the edge and corner of the floating gate 28. The $Si_3N_4$ layers act as an oxidation barrier and prevent further oxidation of the polysilicon material in the floating gate 28 in subsequent furnace steps.

Figure 15:
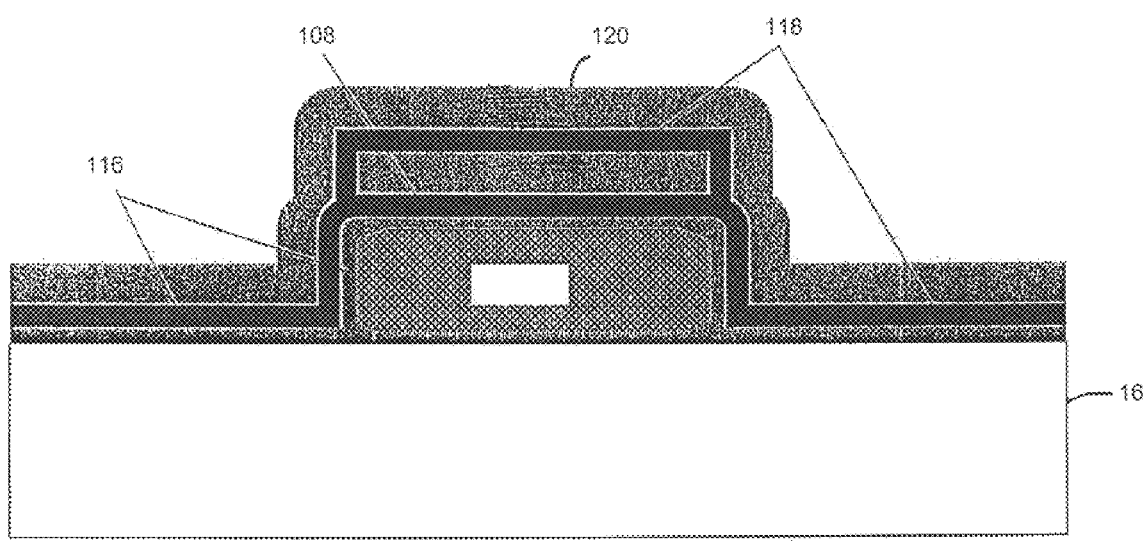

Next, a second layer of $Si_3N_4$ (layer 118), with preferably a thickness in the range 60–300A, is deposited on the structure, as shown in FIG. 15. This layer becomes the $Si_3N_4$ layer of the ONO on the sidewalls of the floating gate 28. A $SiO_2$ layer 120, preferably with a thickness in the range of 100–600A, is then deposited on the second $Si_3N_4$ layer 118, as also shown in FIG. 15. This layer, referred to as a "sidewall spacer," is used to form a thin protective oxide layer on the $Si_3N_4$ sidewall layer 118 during subsequent etching steps.

Figure 16:
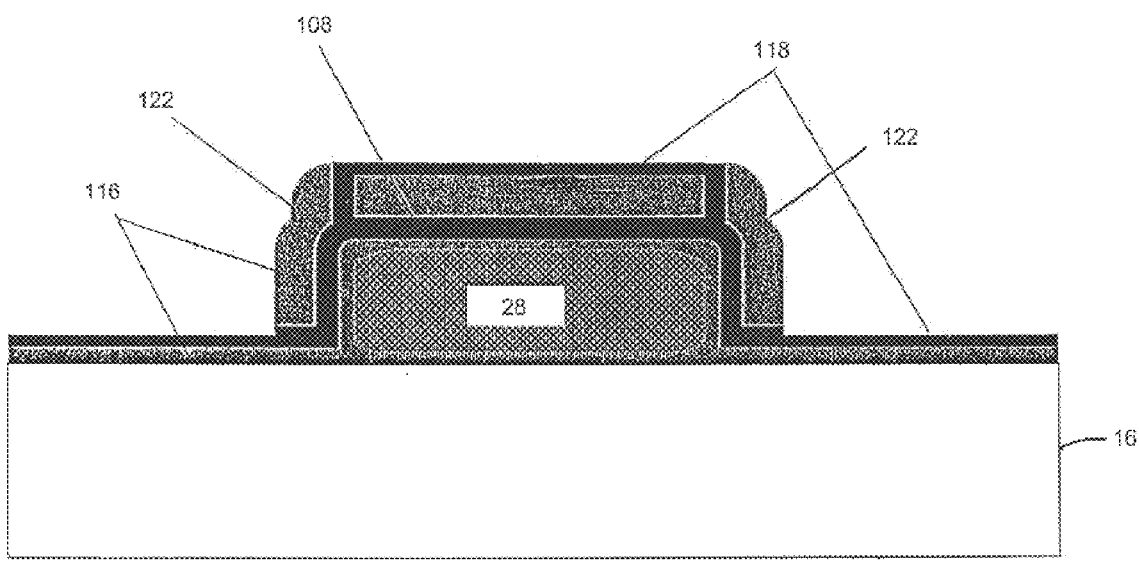

An anisotropic etch is then performed, which etches the top $SiO_2$ layer (layer 120) to leave the sidewall spacers 122 protecting the second $Si_3N_4$ layer 118 on the sidewalls of the floating gate 28, as shown in FIG. 16. The sidewall spacers 122 are important because they prevent the $Si_3N_4$ layer 118 from being etched away from the sidewalls of the floating gate 28, during a subsequent etching step which removes the $Si_3N_4$ layer 118 from the horizontal surfaces of the structure. The sidewall spacers 122 also have another important function. In the next step, the $Si_3N_4$ layer 118 is removed from all horizontal surfaces. During this step the sidewall spacers 122 protect a small portion of the $Si_3N_4$ layer 118, known as the foot 124, on the silicon substrate 16 where the floating gate 28 meets the substrate. This foot 124 helps to seal the lower corner of the polysilicon floating gate 28, during a subsequent thermal oxidation step.

Figure 17:
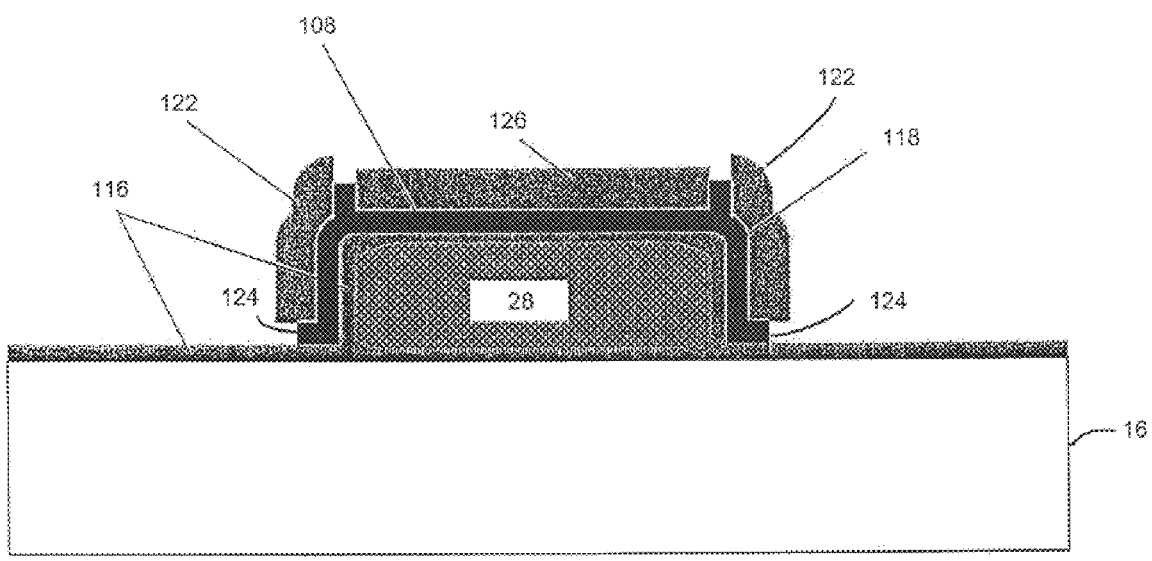

FIG. 17 illustrates the next step described above, which is an isotropic $Si_3N_4$ etch that removes the $Si_3N_4$ layer 118 from the horizontal surfaces of the floating gate 28 and Si substrate 16. The etch has very good selectivity to $SiO_2$, leaving the sidewall spacers 122 in tact. The sidewall spacers 122 and sacrificial oxide layer 126 on top of the floating gate 28 remaining protect the $Si_3N_4$ material surrounding the top and side surfaces of the floating gate 28 during etching. The protected $Si_3N_4$ material is intended to remain as part of the ONO. As those of ordinary skill in the art will appreciate, it is important to control the time of etching and etch rate so that the vertical sidewall $Si_3N_4$ layers whose ends are exposed to the etch are not etched below the level of the first $Si_3N_4$ layer 108. It is desired to maintain a continuous $Si_3N_4$ layer around the floating gate 28.

Figure 18:
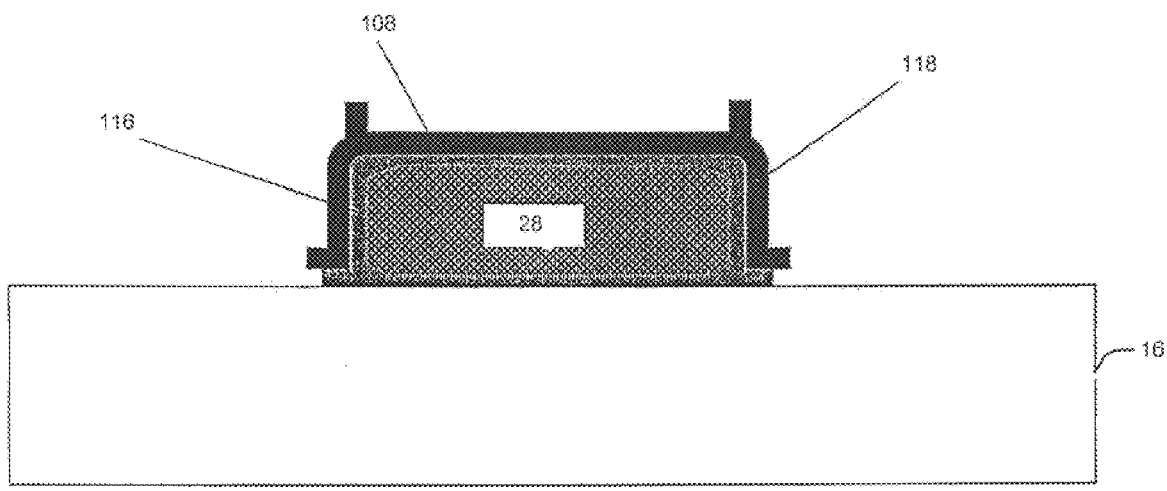

Next, an isotropic $SiO_2$ etch is performed. This removes the sidewall spacers 122, sacrificial oxide layer 126 on top of the floating gate 28, and the $SiO_2$ on the surface of the substrate 16 surface in the active region along which the cross-section is shown in FIG. 18. The etch has a very low etch rate for $Si_3N_4$, leaving the $Si_3N_4$ on the top and sidewalls of the floating gate 28 in tact.

Figure 19:
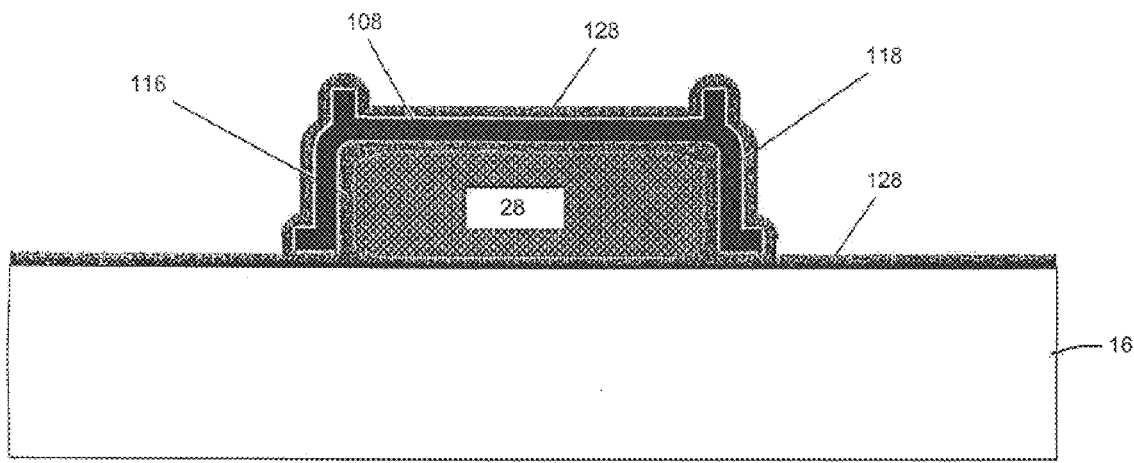
Figure 20:
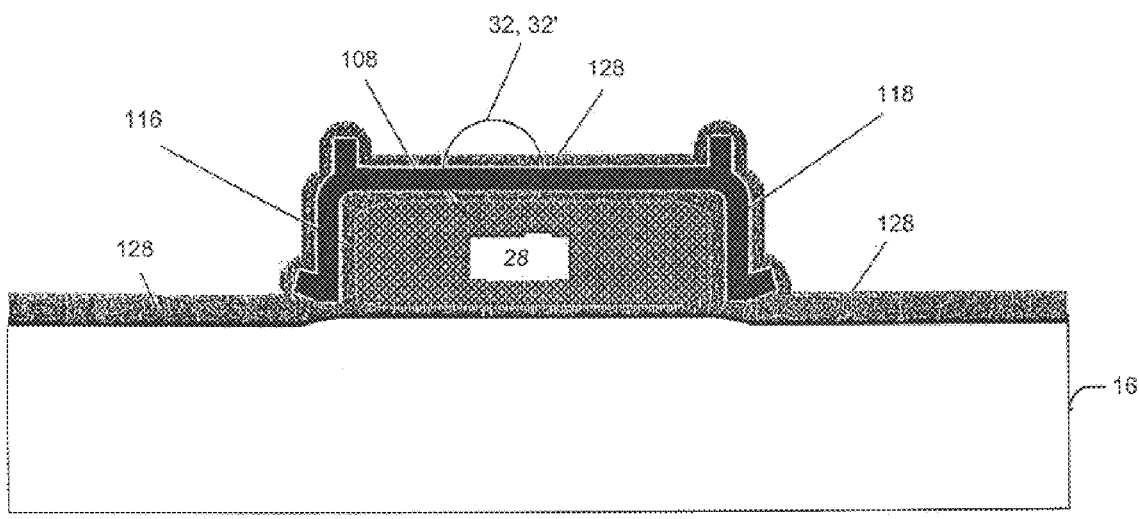

In the next step, a conformal $SiO_2$ layer 128, preferably with a thickness in the range of 40–120A, is deposited on the structure, as shown in FIG. 19. This layer becomes the top $SiO_2$ layer of the ONO film on the top and sidewalls of the floating gate 28. It will also become a portion of the select transistor gate oxide. A thermal oxidation step is then performed that thickens the $SiO_2$ on the Si substrate 16, as shown in FIG. 20. This step forms the select transistor gate oxide, which is an insulating layer between the substrate 16 and a second conductive layer (deposited in a later step). The step is carried out so that the desired final thickness of the select transistor gate oxide is attained, which is preferably in the range of 200–300A, and for the added purpose of annealing and densifying the deposited film. The remaining $Si_3N_4$ layer (108, 118) does not become oxidized in this step because the temperature applied during this step, which is preferably between 800 and 1000 deg C. is too low to grow a significant oxide on it.

Figure 21:
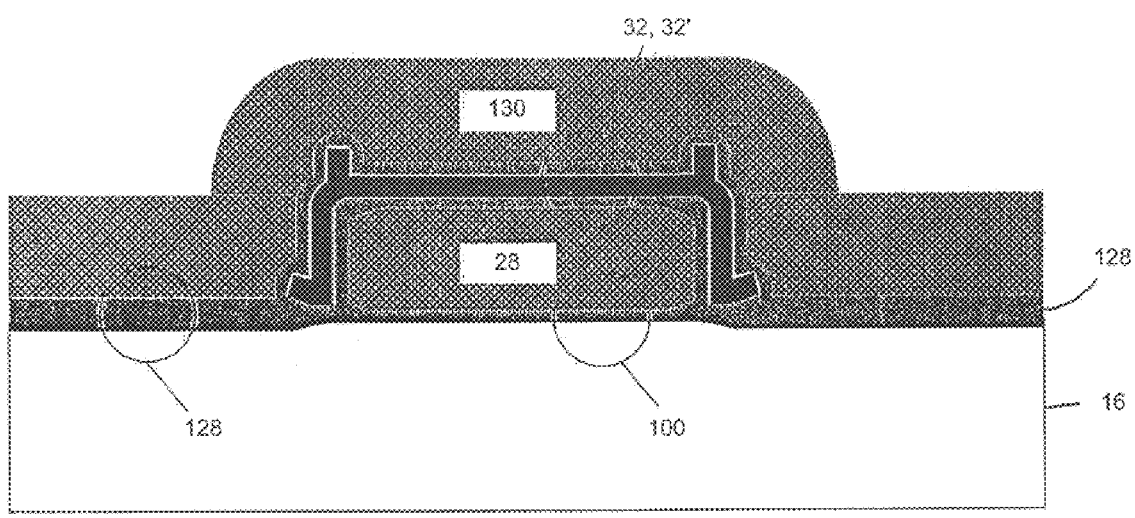
FIGS. 21–24 illustrate the process steps involved in fabricating the second conductive layer according to the present invention.

In the next phase of the process, the shared gate electrode of the select and memory transistors is formed. In the initial step in this phase, a polysilicon layer 130, preferably with a thickness in the range of 1000–3000A, is deposited on the ONO film and select transistor gate oxide, as shown in FIG. 21. Next, the polysilicon layer 130 is doped to make the layer conductive. In this step, preferably n- or p-dopants are introduced into the polysilicon layer 130. This may be accomplished by either annealing the layer in a phosphorus oxychloride ($POCL_3$) gas, by doping the polysilicon layer 130 in-situ when deposited, i.e., during the depositing step, or by implantation. As those of ordinary skill in the art will appreciate, other methods may be used to dope the polysilicon layer 130. It should be noted, however, that the particular method and point at which the polysilicon layer 130 is doped is not part of the present invention.

Figure 22:
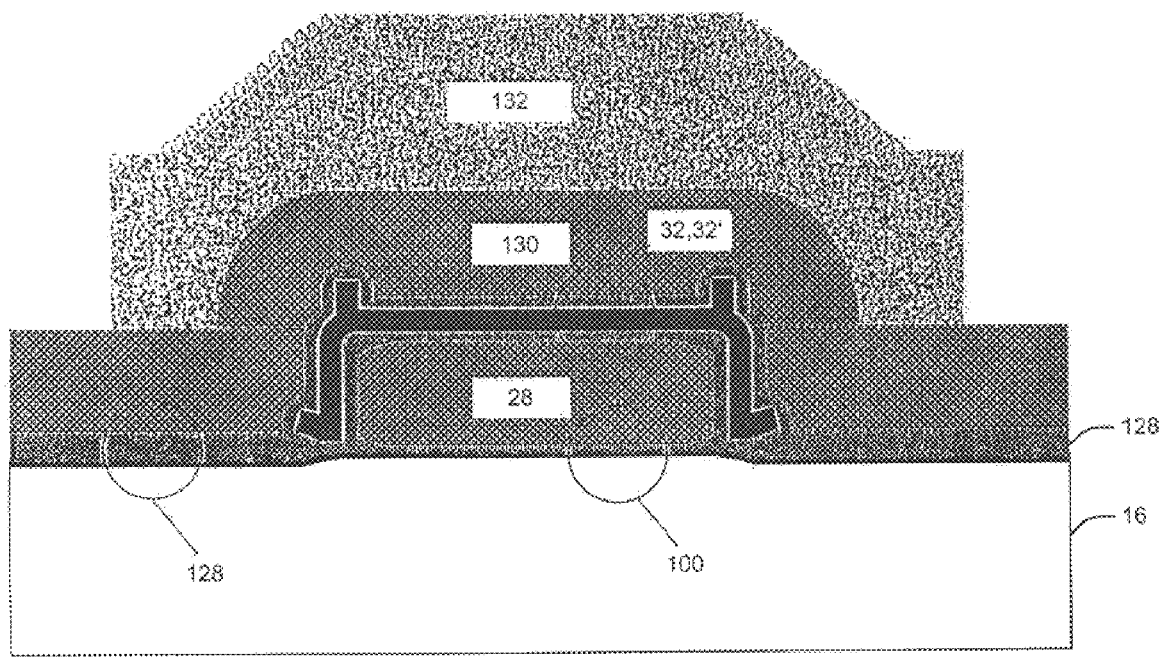
Figure 23:
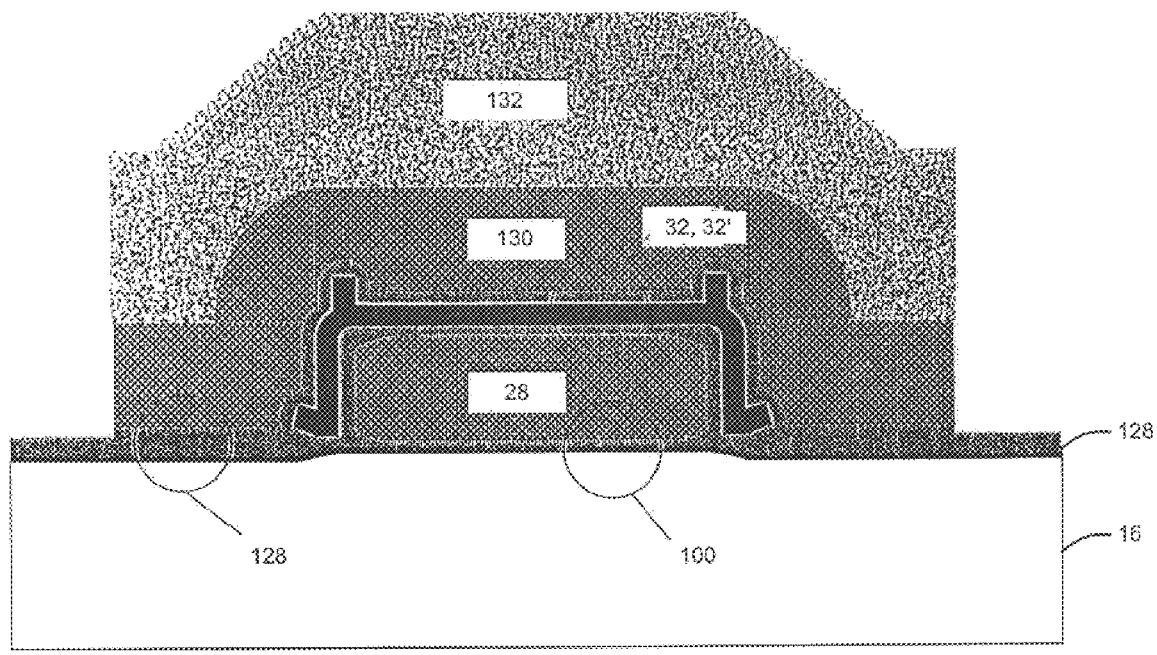
Figure 24:
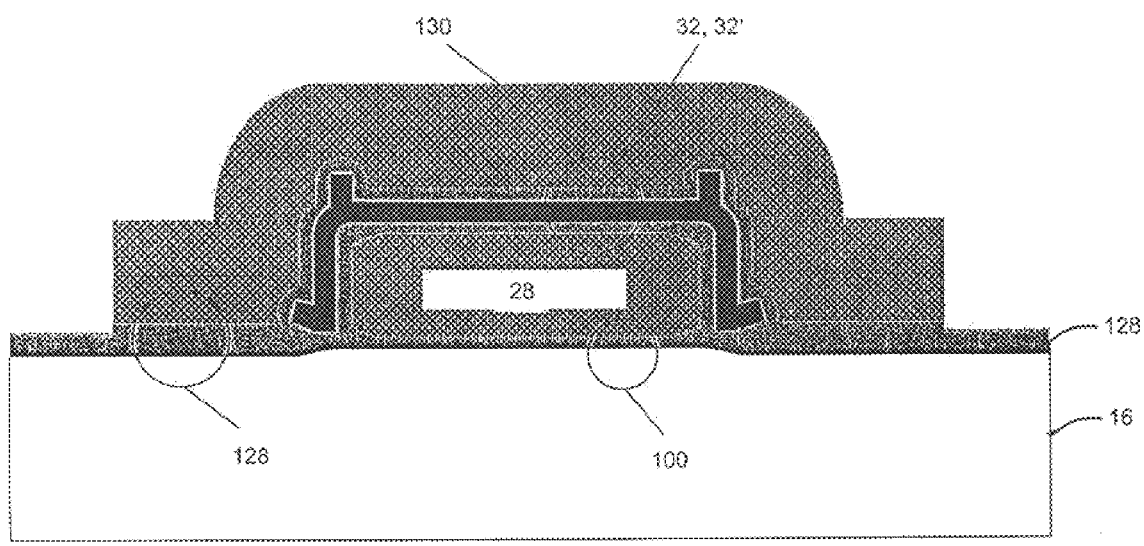

Next, a protective photoresist layer 132 is deposited on a portion of the polysilicon layer 130, as shown in FIG. 22. The protective photoresist layer 132 is patterned with a mask to define the gate electrodes of the transistors of the memory cell. An etch step is then performed, which removes the portion of the polysilicon layer 130 that is not covered by the protective photoresist layer 132, and which stops within the gate oxide of the select transistor, as shown in FIG. 23. Next, the protective photoresist layer 132 is removed, as shown in FIG. 24. The ONO film is left covering the sidewalls and top of the floating gate 28, while being removed outside of the floating gate region to allow a standard thermal gate oxide for the select transistor.

The remaining steps required to form the remaining components of the memory cell, such as formation of source and drain regions and metal interconnect, can then be done to complete the fabrication process. The details of these steps do not form a part of the present invention.

While the embodiments discussed above involve the fabrication of p-channel cells, those of ordinary skill in the art will appreciate, the present invention is equally applicable to an n-channel cell. It should further be recognized that the present invention is also independent of the method of programming and erasing the memory cell. Furthermore, the present invention is applicable to other split-gate cells in EEPROM devices and other memory cells in general. In addition, those of ordinary skill in the art should appreciate that other process steps (not forming a part of the present invention) are involved in fabrication of a memory cell then those described herein. It should therefore be evident that the particular embodiments disclosed above may be altered or modified and all such variations are considered within the scope and spirit of the invention. Accordingly, the protection sought herein is as set forth in the claims below.

What claimed is:

1. A method of fabricating a memory cell of a semiconductor device, comprising the steps of:
    (a) depositing a first conductive layer having a top surface and a side surface; and
    (b) forming an ONO film adjacent to the top surface and the side surface of said first conductive layer, said step of forming the ONO film comprising the steps of:
        (i) depositing a first $SiO_2$ layer;
        (ii) depositing a first $Si_3N_4$ layer on the first $SiO_2$ layer;
        (iii) depositing a second $SiO_2$ layer on the first $Si_3N_4$ layer;
        (iv) depositing a first protective photoresist layer on a portion of the second $SiO_2$ layer;
        (v) anisotropically etching away at least the portion of the second $SiO_2$ layer and a portion of the first conductive layer not covered by the first protective photoresist layer;
        (vi) removing the first protective photoresist layer;
        (vii) thermally growing a third $SiO_2$ layer on the side surface of the first conductive layer;
        (viii) depositing a second $Si_3N_4$ layer on the second and third $SiO_2$ layers;
        (ix) depositing a fourth $SiO_2$ layer on the second $Si_3N_4$ layer; and
        (x) anisotropically etching the fourth $SiO_2$ layer so as to leave a portion of said fourth $SiO_2$ layer on a side surface of the second $Si_3N_4$ layer.

2. The method of fabricating a memory cell according to claim 1, wherein the first $SiO_2$ layer is deposited between approximately 60 and 120 angstroms thick, the first $Si_3N_4$ layer is deposited between approximately 60 and 200 angstroms thick, and the second $SiO_2$ layer is deposited between approximately 100 and 500 angstroms thick.

3. The method of fabricating a memory cell according to claim 1, wherein the third $SiO_2$ layer is deposited between approximately 80 and 300 angstroms thick, the second $Si_3N_4$ layer is deposited between approximately 60 and 300 angstroms thick, and the fourth $SiO_2$ layer is deposited between approximately 100 and 600 angstroms thick.

4. The method of fabricating a memory cell according to claim 1, further comprising the step of depositing a second conductive layer on the ONO film.

5. The method of fabricating a memory cell according to claim 4, further comprising the step of doping the second conductive layer with a dopant selected from the group consisting of n- or p-dopants.

6. The method of fabricating a memory cell according to claim 4, further comprising the steps of:
    (a) depositing a second protective photoresist layer on a portion of the second conductive layer;
    (b) etching away the portion of the second conductive layer not covered by the second protective photoresist layer; and
    (c) removing the second protective photoresist layer.

7. The method of fabricating a memory cell according to claim 1, further comprising the step of forming an insulating layer on a substrate, said insulating layer being disposed between the substrate and the first conductive layer.

8. The method of fabricating a memory cell according to claim 7, wherein the step of forming the insulating layer on the substrate further comprises the steps of:
    (a) growing a first $SiO_2$ layer on the substrate that is between approximately 80 and 120 angstroms thick;
    (b) depositing a second $SiO_2$ layer onto the substrate that is between approximately 40 and 120 angstroms thick; and
    (c) thermally oxidizing the second $SiO_2$ layer to a thickness of between approximately 200 and 300 angstroms.

9. The method of fabricating a memory cell according to claim 1, wherein the step of depositing a first conductive layer includes the step of depositing a poly-silicon layer that is between approximately 1000 and 3000 angstroms thick.

10. The method of fabricating a memory cell according to claim 1, wherein the step of forming the ONO film further comprises isotropically etching any exposed portion of the second $Si_3N_4$ layer.

11. The method of fabricating a memory cell according to claim 10, wherein the step of forming the ONO film further comprises isotropically etching any exposed portions of all the $SiO_2$ layers.

12. The method of fabricating a memory cell according to claim 11, wherein the step of forming an ONO stack film, further comprises the steps of:
    (a) depositing a fifth $SiO_2$ layer; and
    (b) performing a thermal oxidation step so as to thicken at least a portion of the fifth $SiO_2$ layer.

13. The method of fabricating a memory cell according to claim 12, wherein at least a portion of the fifth $SiO_2$ layer is formed between approximately 200 and 300 angstroms thick.

* * * * *